April 27, 1965 J. R. WILLIAMS 3,180,766
HEAVILY DOPED BASE RINGS
Original Filed Dec. 30, 1958

INVENTOR
JOHN R. WILLIAMS
BY H. Vincent Harsha
ATTORNEY 3,180,766

HEAVILY DOPED BASE RINGS

John R. Williams, Natick, Mass., assignor to Raytheon Company, a corporation of Delaware Continuation of application Ser. No. 783,850, Dec. 30, 1958. This application May 12, 1961, Ser. No. 111,419
11 Claims. (Cl. 148—33)

This is a continuation of my now abandoned application, Serial No. 783,850, filed December 30, 1958.

This invention relates generally to the construction of semiconductor devices and, more particularly, to the construction of base regions for transistors.

In the construction of transistors having conventional emitter, collector, and base regions, it is desirable that the cross-sectional area of the base region be as small as possible. In the fabrication of transistors by diffusion methods, for example, the width of the base region may be on the order of .0001 inch. Because the base region width is so small, it is extremely difficult to attach a connector to it without shorting out the transistor entirely. A great deal of care and experience has been required in constructing such delicate connections in prior art transistor units. This invention eliminates to a large extent the difficulty involved in making such connections by using a heavily doped base ring which alloys with the silicon or germanium chip. After the alloying process, a heavily doped, annular-shaped region containing the base impurity exists within the semiconductor chip at a point well removed from the junction regions which provide transistor operation. Because the heavily doped region is removed from the junction regions primarily concerned with carrier flow, there is no danger of shorting out the transistor. The fact that the heavily doped region is relatively large and easily accessible makes it much easier to attach a connector to the annular-shaped base of the transistor. Because the base region is of an annular shape, the resistance properties of the base region with respect to the emitter region are improved and the electrical characteristics thereby are enhanced. While particularly useful in diffusion type transistors, the invention is also generally applicable to all transistor types.

The invention may be more easily described with the help of the drawing in which.

Figure 1:
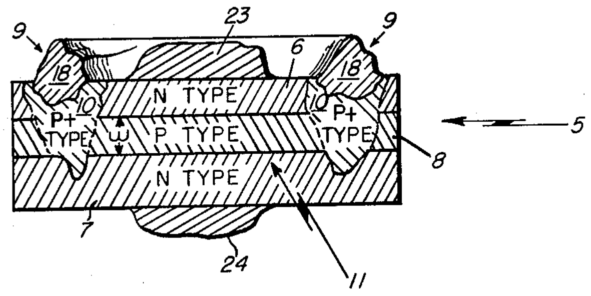
FIG. 1 shows a cross-sectional view, taken along the line 1—1 of FIG. 2 of a diffused transistor, which utilizes a particular embodiment of the invention.

In FIG. 1, there is shown a silicon chip 5 of the diffused n-p-n type having three impurity regions. An upper region 6 containing an n-type impurity is diffused into the upper portion of silicon chip 5 by well-known diffusion methods to form an emitter region. Similarly, n-type impurity region 7 is diffused into the lower portion of silicon chip 5 to form a collector region. The p-type base region 8 between regions 6 and 7 has a very small width, *w*, to which it is extremely difficult to attach a conductor for connection to an external circuit. An annular-shaped ring 9 containing a heavy concentration of p-type impurities is placed upon the surface of silicon chip 5 at the upper region 6. This configuration is more clearly shown in the plan view of FIG. 2, in which a top view of the transistor is shown.

Annular ring 9 contains a heavy concentration of a p-type impurity. Upon firing at a predetermined temperature, the annular ring alloys with silicon chip 5. Upon cooling, a heavily doped, irregularly shaped p-type region 10 (denoted as a p+ region) is precipitated out and regrows onto the parent chip. A connection may then be easily made to metallic base ring region 18 of base ring 9. The heavily doped p-type region 10 penetrates well into the silicon chip, but, since it is substantially removed from the transistor operating region 11 between n-type regions 6 and 7, there is no possibility that the transistor will be shorted out when an external conductor is attached to region 9. It has been found that, if base ring 9 and region 10 are heavily doped, the low frequency parameters of the transistor unit are not greatly affected. Conducting buttons 23 and 24 are soldered to emitter region 6 and collector region 7, respectively.

Figure 3:
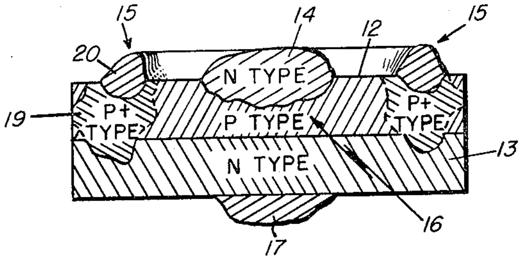
FIG. 3 shows a cross-sectional view of a fused-diffused type of transistor utilizing a particular embodiment of the invention.

Such a construction utilizing a heavily doped base ring is also applicable to a fused-diffused type of transistor unit, as shown in FIG. 3. In that figure, a p-type upper region 12 is provided in an n-type silicon chip 13 by well-known diffusion methods, as mentioned in connection with FIG. 1. A second n-type region 14 is then fused to p-type region 12, according to well-known fusion methods. An annular-shaped ring 15 containing a heavy concentration of p-type impurity is placed on the p-type upper region of the silicon chip so as to encircle n-type region 14. The unit is then fired at a predetermined temperature and the heavily doped base ring is then allowed to penetrate relatively deeply through p-type region 12 into n-type region 13. Upon cooling, a large, irregularly shaped region 19 of base ring 15 containing a heavily doped p-type material is precipitated and regrows onto the silicon chip. An upper metallic region 20 of base ring 15 is available for an electrical contact. This contact area is well removed from the fused-diffused region 16 where transistor operation takes place. The transistor is shown mounted on a conducting button 17 to which another electrical contact may be made for the collector n-type region 13.

Figure 2:
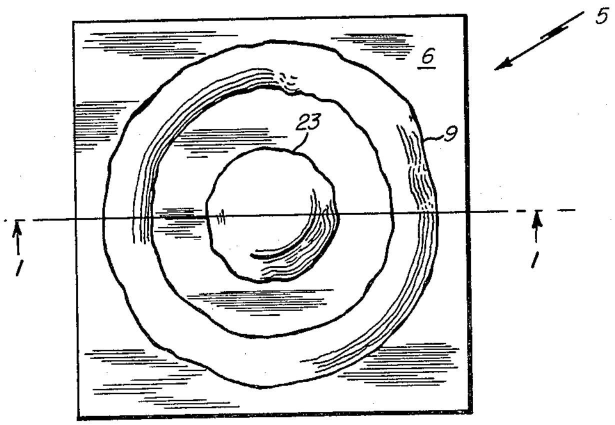
FIG. 2 shows a plan view of the diffused transistor shown in FIG. 1.

The examples shown in FIGS. 1–3 represent applications of the invention to particular types of transistor structures. The invention is, of course, applicable to other types of transistor structures such as grown-junctions or melt-back units and any other types of diffusion or fusion transistors. Although the transistor structures shown and described here are of the n-p-n configurations, it is obvious that the invention is also applicable to p-n-p transistor configurations. In many cases, it is desirable to add a neutral softening material such as tin to the heavily doped base ring to help dissolve the silicon and, thus, aid in alloying the base ring with the silicon chip and to prevent cracking upon cooling.

Although the above discussion of the invention describes the use of silicon chips, it is obvious that the invention is also applicable to the use of other semiconductor materials such as germanium. Other variations in the transistor configuration utilizing the annular shaped base ring of the invention will occur to those skilled in the art without departing from the scope of the invention. Thus, the invention is not to be construed to be limited to the particular embodiments shown and described herein except as defined by the appended claims.

What is claimed is:

1. A transistor comprising a piece of silicon material having a base region containing a p-type impurity, an emitter region containing an n-type impurity diffused into one side of said silicon material for providing a first n-p emitter to base junction, a collector region containing an n-type impurity diffused into the other side of said silicon material for providing a p-n base to collector junction, the distance between said junctions being extremely small, an annular shaped region containing a heavy concentration of p-type impurity alloyed with said silicon material so as to penetrate through said emitter and base junction to said base to collector junction, said annular shaped region having an exposed portion on he surface of said semiconductor device to which an external connector may be easily attached.

2. A transistor comprising a piece of silicon material having a base region containing a p-type impurity, an emitter region containing an n-type impurity fused into one side of said silicon material for providing a first n-p emitter to base junction, a collector region containing an n-type impurity diffused into the other side of said silicon material for providing a p-n base to collector junction, the distance between said junctions being extremely small, an annual shaped region containing a heavy concentration of p-type impurity alloyed with said silicon material so as to penetrate through said emitter and base junction to said base to collector junction, said annular shaped region having an exposed portion on the surface of said semiconductor device to which an external connector may be easily attached.

3. A transistor comprising a semiconductor material having a first region containing a first impurity, second and third regions adjacent opposite sides of said first region and each containing a second impurity of a type opposite to said first impurity for providing first and second junction regions with said first region, an annular shaped region containing a heavy concentration of said first impurity alloyed with said semi-conductor material so as to penetrate through said first junction region.

4. A transistor comprising a semiconductor material having a first region containing a first impurity, second and third regions diffused into opposite sides of said first region and each containing a second impurity of a type opposite to said first impurity for providing first and second junction regions with said first region, an annular shaped region containing a heavy concentration of said first impurity alloyed with said semiconductor material so as to penetrate through said first and second junction regions to said third region.

5. A transistor comprising a semiconductor material having a first region containing a first impurity, a second region fused into one side of said first region and containing a second impurity of a type opposite to said first impurity, a third region diffused into the opposite side of said first region and containing said second impurity, said second and third regions providing first and second junction regions with said first region, an annular shaped region containing a heavy concentration of said first impurity alloyed with said semi-conductor material so as to penetrate through said first junction region to at least said third junction region.

6. A transistor structure comprising a body of semiconductive material having an emitter region of a first conductivity type, a diffused base region of a second conductivity type, the interface between said emitter and base regions constituting a p-n junction, and a contact region surrounding said emitter region and penetrating into said diffused base region and into said body, said contact region being more heavily doped with impurity material imparting said second conductivity type to said contact region than is present in the portion of said diffused region which is not penetrated by said contact region.

7. A transistor structure comprising a body of semiconductive material having an emitter region of a first conductivity type, a diffused base region of a second conductivity type, the interface between said emitter and base region constituting a p-n junction, and an alloyed contact region surrounding said emitted region and penetrating into said diffused base region, said contact region containing a greater concentration of impurity material imparting said second conductivity type to said contact region than is present in the portion of said diffused base region which is not penetrated by said contact region.

8. In a transistor, the combination of a body of semiconductor material of a first conductivity type, a base region of a second conductivity type forming a junction with said body, an emitter region of said first conductivity type forming a junction with said base region, and a heavily doped base contact region of said second conductivity type positioned in said base region and penetrating through said first-mentioned junction.

9. In a transistor, the combination of a body of semiconductor material of a first conductivity type forming a collector region, a base region of a second conductivity type forming a collector to base junction with said body, an emitter region of said first conductivity type forming a base to emitter junction with sad base region, and an annular heavily doped contact region of said second conductivity type surrounding said base to emitter junction and penetrating through said collector to base junction.

10. A transistor device comprising in combination an emitter region of a first conductivity type, a base region of a second conductivity type, the interface between said emitter and base regions constituting a first p-n junction, a collector region of said first conductivity type, the interface between said collector and base regions constituting a second p-n junction, and a contact region surrounding said first p-n junction and penetrating into at least said base region said contact region being more heavily doped with said second conductivity type than said base region.

11. A transistor device comprising in combination a collector region of a first conductivity type, a base region of a second conductivity type forming a first p-n junction with said collector region, an emitter region of said first conductivity type forming a second p-n junction with said base region, and a base contact region of said second conductivity type penetrating into at least said base region, said contact region being more heavily doped with said second conductivity type than said base region, and said base to collector junction extending a greater distance from said base to emitter junction than the distance of said base contact from said base to emitter junction.

References Cited by the Examiner

UNITED STATES PATENTS

| | | | |
|---|---|---|---|
| 2,952,896 | 9/60 | Cornelison et al. | 29—25.3 |
| 2,954,307 | 9/60 | Shockley | 148—33.2 |
| 2,959,505 | 11/60 | Riesz | 148—1.5 X |

DAVID L. RECK, *Primary Examiner.*

RAY K. WINDHAM, *Examiner.*